US010075172B2

(12) United States Patent
Dedic et al.

(10) Patent No.: US 10,075,172 B2
(45) Date of Patent: Sep. 11, 2018

(54) TIMING-DIFFERENCE MEASUREMENT

(71) Applicant: SOCIONEXT INC., Yokohama-shi, Kanagawa (JP)

(72) Inventors: Ian Juso Dedic, Northolt (GB); Gavin Lambertus Allen, Seabird (AU); Bernd Hans Germann, Brombachtal (DE); Albert Hubert Dorner, Lahr (DE)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 15/455,901

(22) Filed: Mar. 10, 2017

(65) Prior Publication Data

US 2017/0264304 A1    Sep. 14, 2017

(30) Foreign Application Priority Data

Mar. 11, 2016    (EP) .................................... 16160038

(51) Int. Cl.
*H03L 7/085* (2006.01)
*H03L 7/091* (2006.01)
*G04F 1/00* (2006.01)

(52) U.S. Cl.
CPC .............. *H03L 7/085* (2013.01); *H03L 7/091* (2013.01); *G04F 1/005* (2013.01)

(58) Field of Classification Search
CPC ......... H03L 7/085; H03L 7/091; H03L 7/095; G04F 10/005
See application file for complete search history.

(56) References Cited

U.S. PATENT DOCUMENTS

| 6,124,745 A * | 9/2000 | Hilton .................... H03K 5/133 327/276 |
| 6,480,035 B1 | 11/2002 | Donnelly et al. |
| 2003/0035499 A1 | 2/2003 | Staszewski et al. |

FOREIGN PATENT DOCUMENTS

| EP | 0 161 758 A2 | 11/1985 |
| EP | 2 211 468 A1 | 7/2010 |
| EP | 2 849 345 A1 | 3/2015 |
| GB | 2 067 371 A | 7/1981 |

OTHER PUBLICATIONS

Extended European Search Report of related European Patent Application No. 16160038.2 dated Oct. 4, 2016.

* cited by examiner

*Primary Examiner* — Jung Kim
(74) *Attorney, Agent, or Firm* — Arent Fox LLP

(57) ABSTRACT

There is disclosed herein current-mode circuitry for measuring a timing difference between first and second signals, the circuitry comprising: a tail node configured during a measurement operation to receive a current pulse in dependence upon the first signal; first and second nodes conductively connectable to said tail node along respective first and second paths; and steering circuitry configured during the measurement operation to control such connections between the tail node and the first and second nodes based on the second signal to steer the current pulse so that a first portion of the current pulse passes along the first path and a second portion of the current pulse passes along the second path in dependence upon the timing difference between said first and second signals; and a signal output unit configured to output a measurement-result signal indicating a measure of said timing difference based upon one or both of the first and second portions.

21 Claims, 8 Drawing Sheets

TIMING-DIFFERENCE MEASUREMENT

CROSS-REFERENCE TO RELATED APPLICATIONS

This application claims priority to European Patent Application No. 16160038.2, filed Mar. 11, 2016. The disclosure of the priority application is incorporated in its entirety herein by reference.

The present invention relates to circuitry for measuring a timing difference between signals, for example for use in a phase detector/comparator of phase-locked loop or phase-lock loop (PLL) circuitry.

FIG. 1 is a schematic diagram of example PLL circuitry 1. PLL circuitry 1 comprises a reference clock (REFCLK) source 2, a phase comparator 4, a charge pump 6, a loop filter 8, a voltage-controlled oscillator (VCO) 10, a clock-controlled circuit 12, and a divider 14.

The charge pump 6 is connected to be controlled by the output of the phase comparator 4. The output of the charge pump 6, after being filtered by the loop filter 8, controls the VCO 10. The VCO 10 outputs one or more clock signals (in the case of FIG. 1, four clock signals) to the clock-controlled circuit 12. One or more of the clock signals (VCOCLK) output from the VCO are also fed back via the divider 14 as a clock signal VCODIV to the phase comparator, which also receives an input from the reference clock source 2. Accordingly, as is known from general PLL theory the PLL circuitry 1 serves to lock the clock signal or clock signals output by the VCO 10 into phase alignment with the reference clock signal REFCLK, with some difference in frequency between the clock signals REFCLK and VCOCLK dependent on the divider ratio set in the divider 14.

Although typical VCO circuits output a single clock signal, the VCO 10 is indicated as outputting four clock signals as mentioned above. This is to indicate the applicability of the PLL circuitry 1 (and indeed of embodiments of the present invention) to the analogue-to-digital converter (ADC) circuitry of EP2211468, the entire contents of which are incorporated herein by reference, and to the digital-to-analogue converter (DAC) circuitry of EP2849345, again the entire contents of which are incorporated herein by reference. As will be apparent from FIGS. 9 to 13 of EP2211468, the ADC circuitry operates based on quadrature (4-phase) clock signals, comprising four time-interleaved substantially sinusoidal clock signals having relative phases 0°, 90°, 180° and 270°. The same is true of the DAC circuitry of EP2849345, for which see for example FIG. 15B of that document. Accordingly, the clock-controlled circuitry 12 of FIG. 1 is indicated as being an ADC or DAC by way of example, and this example will be continued as a running example here with the understanding that the clock-controlled circuitry 12 could be any circuitry operable based on one or more clock signals.

Focussing now on the phase comparator (phase detector) 4 of FIG. 1, FIG. 2 presents a signal diagram of its input clock signals, namely the clock signal VCODIV being the clock signal fed back from the VCO 10 via the divider 14, and the reference clock signal REFCLK.

Typically, the task of PLL circuitry such as PLL circuitry 1 is to maintain a relationship between the clock signal VCODIV and the reference clock signal REFCLK, so that there is also a (demanded or target) relationship between the clock signal VCOCLK fed to the clock-controlled circuit 12 and the reference clock signal REFCLK.

This demanded relationship may for example be set by controlling the division factor applied by divider 14 or by controlling some other element in the PLL circuitry 1 such as the phase comparator for itself. Therefore, the job of the phase comparator 4 (phase detector) may be summarised as to create an output signal to be fed along the path to the VCO 10 such that a desired X cycles of the clock signal VCODIV occur for each 1 cycle of the reference clock signal REFCLK, as indicated in FIG. 2. Incidentally, although clock signal VCODIV is shown in FIG. 2, the clock signal VCO itself or a clock signal derived therefrom could equally be shown, with the value X adjusted accordingly. For this reason, such signals will be generically indicated as being VCO hereinafter.

Bearing in mind that the value X may have both integer and fraction components, the challenge is to maintain such an integer and fraction relationship as accurately as possible for the PLL circuitry 1 to output the intended VCO clock frequency (i.e. achieve the target locked state). This will of course affect the operation of the clock-controlled circuitry 12.

It has been found that known circuitry for use in a phase detector is not accurate enough for some applications, particularly high-frequency applications. It is accordingly desirable to provide circuitry for use in PLL circuitry with improved accuracy.

According to an embodiment of a first aspect of the present invention, there is provided current-mode circuitry for measuring a timing difference between first and second signals, the circuitry comprising: a tail node configured during a measurement operation to receive a current pulse in dependence upon the first signal; first and second nodes conductively connectable to said tail node along respective first and second paths; and steering circuitry configured during the measurement operation to control such connections between the tail node and the first and second nodes based on the second signal to steer the current pulse so that a first portion of the current pulse passes along the first path and a second portion of the current pulse passes along the second path in dependence upon the timing difference between said first and second signals.

It will be appreciated that references to current-mode circuitry could be expressed as references to charge-mode circuitry. For example, charge is the integral of current over a pulse period. Also, the current pulse may be described simply as a current in some embodiments.

Such circuitry may comprise a signal output unit configured to output a measurement-result signal indicating a measure of said timing difference based upon one or both of the first and second portions.

The technique of dividing a current pulse based upon the timing difference between the first and second signals advantageously enables accurate measurements to be taken. For example, current-splitting can be done accurately even with high-frequency signals.

The steering circuitry is configured to steer the current such that the first portion passes along the first path and then the second portion passes along the second path. That is, the current passes firstly along one of the paths and then along the other, with perhaps only a transitional period over which some current passes along both paths simultaneously (relating to rise/fall times etc.).

The control circuitry may comprise switching circuitry provided along the paths, the switching circuitry configured such that the conductivity of the connections between the tail node and the first and second nodes is controlled by the second signal. Such switching circuitry may comprise transistors such as MOSFETs.

The switching circuitry may comprise a first transistor whose channel forms part of the first path and a second transistor whose channel forms part of the second path, wherein gate terminals of those transistors are controlled by the second signal.

The circuitry may comprise a controllable (e.g. voltage controlled) current source configured to provide said current pulse in dependence upon the first signal. The first signal is preferably a square-wave, or switched logic-level signal, such that the current pulse has a switched logic-level form, i.e. a flat (linear) top at least over a central portion of the pulse. This may enable linear operation of the circuitry, improving the accuracy in the measures.

The signal output unit may be configured to output the measurement-result signal based upon a difference in the size of the first and second portions, or in dependence upon the size of one of the first and second portions.

The signal output unit may comprise first and second capacitances connected to the first and second nodes, respectively, for converting the first and second portions of the current pulse into corresponding first and second potential differences. Such potential differences or voltages may be readily employed by further circuitry.

The signal output unit may comprise analogue-to-digital conversion circuitry and the measurement-result signal may be a digital signal. Thus, circuitry according to the present aspect may be referred to as time-to-digital converter (TDC) circuitry.

As above, one or both of the first and second signals may be switched logic level signals. Preferably, at least the first signal is a switched logic level signal since it controls the form of the current pulse. A current pulse with a switched-level or switched logic-level form may facilitate linear operation of circuitry according to the present aspect. Such switched level signals have rising and falling edges, which may be readily detected for example.

The first and second signals may be clock signals, or other repetitive signals e.g. with a repeating pattern of edges.

According to an embodiment of a second aspect of the present invention, there is provided a phase detector, comprising current-mode circuitry according to the aforementioned first aspect of the present invention.

In such a phase detector, the current-mode circuitry may be configured to repeatedly measure such timing differences between the first and second signals, generating a sequence of measures of the timing differences.

Such a phase detector may comprise: reference circuitry operable, in dependence upon a target (or demanded or input or reference) relationship between said first and second signals, to generate a sequence of reference values indicating timing differences between the first and second signals corresponding to (or meeting or respecting or satisfying) the target relationship; comparison circuitry configured to compare the sequence of measures with the sequence of reference values; and a signal output unit operable to output a phase-detection signal in dependence upon a result of the comparison.

Such a phase detector may also comprise calibration circuitry operable to calibrate operation of the phase detector in dependence upon the sequences of reference values and measures. For example, such circuitry may operate based on error values, corresponding to differences between respective reference values and measures. The calibration circuitry may be configured to detect gain and/or offset errors. The calibration circuitry may be configured—in order to effect the calibration—to adjust an ADC reference value or tail current of the current-mode circuitry or adjust an offset trim in a comparator in ADC circuitry of the current-mode circuitry, or adjust the timing of clock signals employed, or add an offset to the output measures.

According to an embodiment of a third aspect of the present invention, there is provided phase-locked loop circuitry, comprising a phase detector according to the aforementioned second aspect of the present invention.

According to an embodiment of a fourth aspect of the present invention, there is provided digital-to-analogue converter circuitry or analogue-to-digital converter circuitry, comprising current-mode circuitry according to the aforementioned first aspect of the present invention, or a phase detector according to the aforementioned second aspect of the present invention, or phase-locked loop circuitry according to the aforementioned third aspect of the present invention.

According to an embodiment of a fifth aspect of the present invention, there is provided an IC chip, such as a flip chip, comprising current-mode circuitry according to the aforementioned first aspect of the present invention, or a phase detector according to the aforementioned second aspect of the present invention, or phase-locked loop circuitry according to the aforementioned third aspect of the present invention, or digital-to-analogue converter circuitry or analogue-to-digital converter circuitry according to the aforementioned fourth aspect of the present invention.

The present invention extends to method aspects corresponding to the apparatus aspects.

Reference will now be made, by way of example, to the accompanying drawings, of which:

FIG. 1, as discussed above, is a schematic diagram of example PLL circuitry;

FIG. 2, as discussed above, presents a signal diagram useful for understanding the intended operation of the FIG. 1 circuitry;

Considering that there is a need to measure a timing difference between first and second signals, the general idea is to create a current pulse in dependence upon the first signal and then to use the second signal to steer that current pulse so that a first portion of it passes along a first path and a second portion of it passes along a second path. Those portions can then be used to output a measurement signal indicating a measure of the timing difference.

Figure 3:
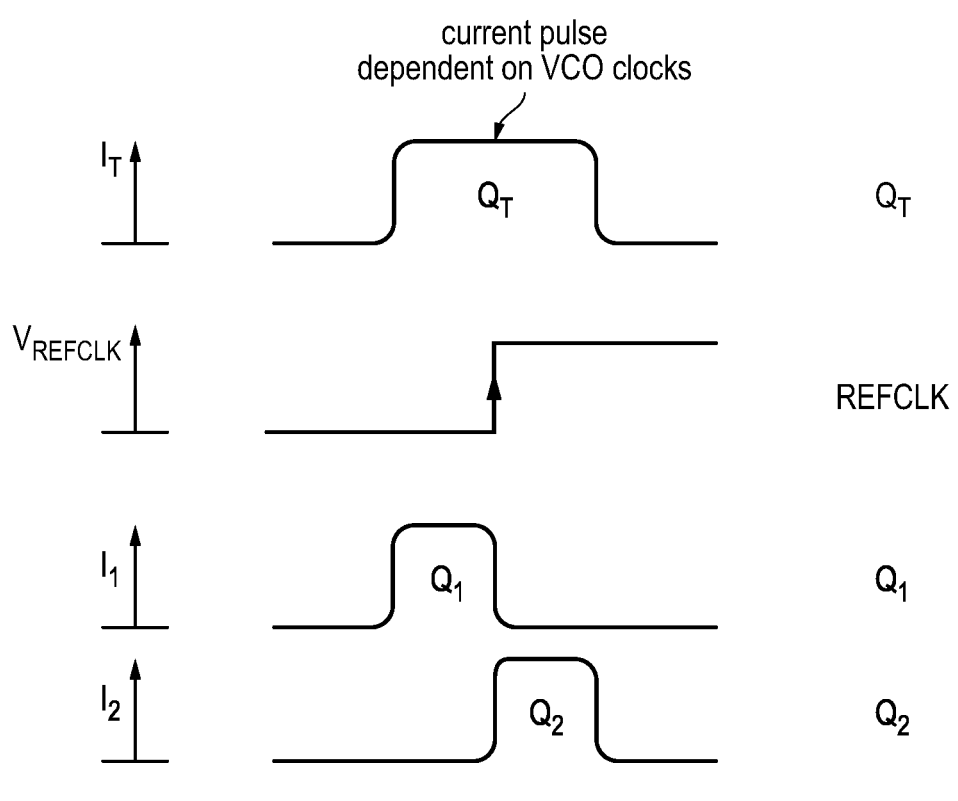
FIG. 3 is a schematic diagram useful for understanding the general principle behind the present invention.

In FIG. 3, therefore, a "total" current $I_T$ is shown flowing such that it creates a current pulse (i.e. a pulse or packet of charge) $Q_T$ in dependence upon the VCO clock signals, e.g. as output by VCO 12. Clock signal REFCLK is also shown with one of its edges, in this example a rising edge, occurring while that current pulse is flowing, with the understanding that clock signal REFCLK is used to direct a (first) portion $Q_1$ of the pulse $Q_T$ along the first path and another (second) portion $Q_2$ along the second path. In this example, the two portions $Q_1$ and $Q_2$ together make up the total pulse $Q_T$. It will be appreciated that the relative sizes of the portions $Q_1$ and $Q_2$ will depend on where the rising edge of the clock REFCLK falls compared to the current pulse $Q_T$ and thus on the timing difference (i.e. relative timing, or phase difference) between the clock signal REFCLK and the VCO clock signals.

Figure 4:
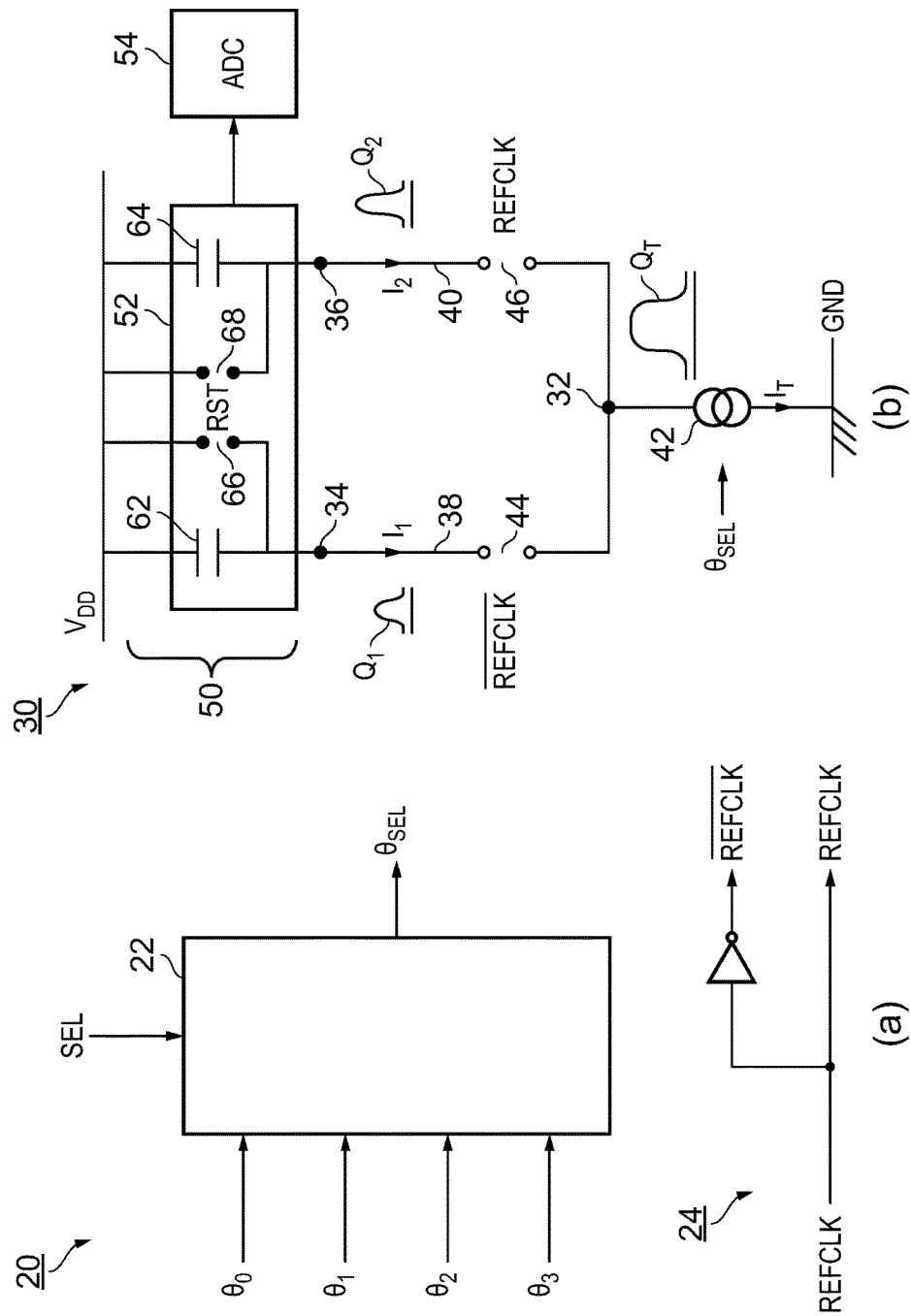
FIGS. 4 and 5 are schematic diagrams presenting an embodiment of the present invention.
Figure 5:
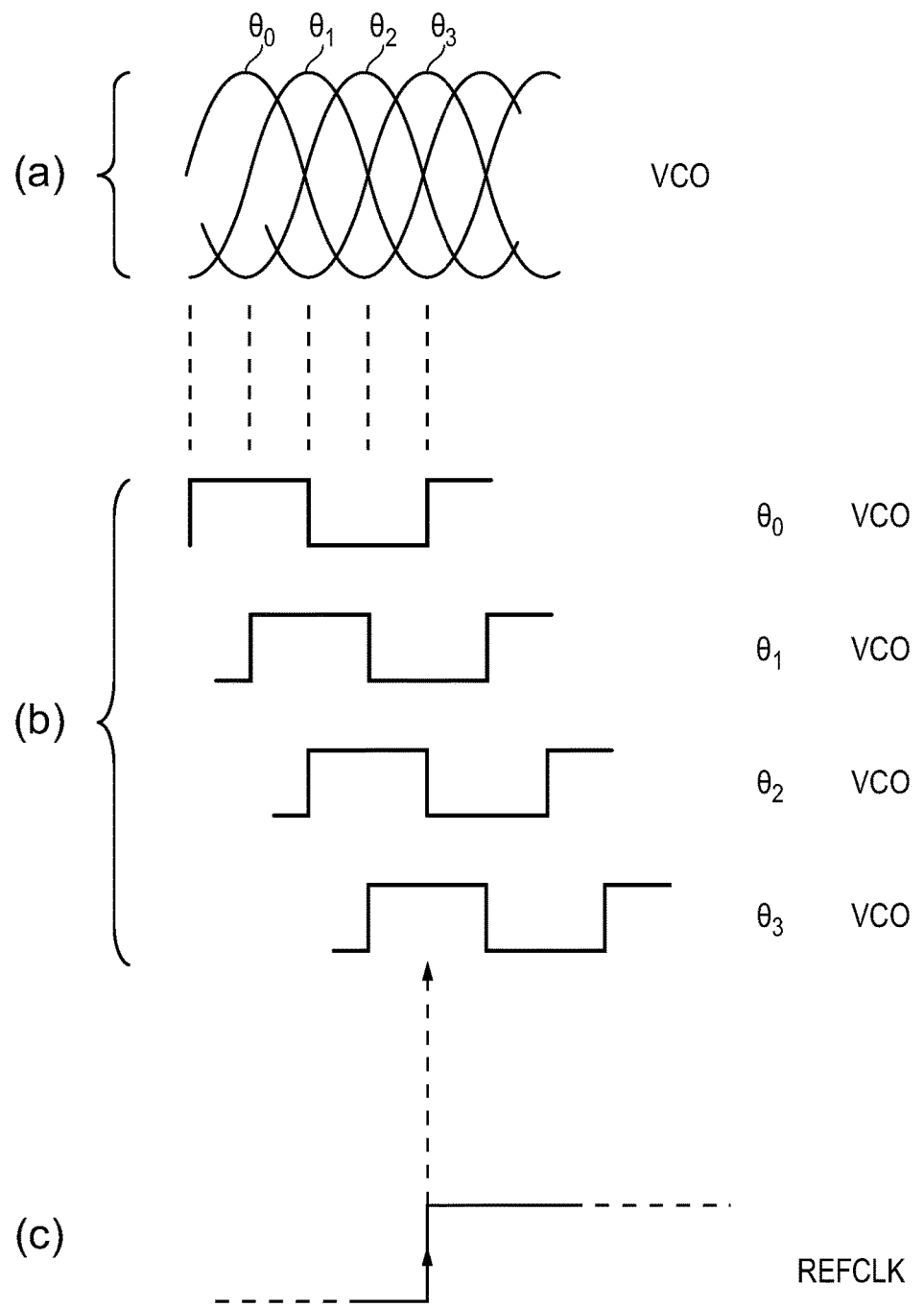

FIGS. 4 and 5 are schematic diagrams presenting an embodiment of the present invention.

FIGS. 4(a) and 4(b) present circuitry arrangements 20 and 30 respectively. As will become apparent, circuitry arrangements 20 and 30 may be employed in combination, however circuitry arrangement 30 may be employed without circuitry arrangement 20 in some embodiments of the present invention. FIGS. 5(a) to 5(c) are signal timing diagrams useful for understanding the operation of the circuitry arrangements 20 and 30.

Circuitry arrangement 20 of FIG. 4(a) comprises a signal selector 22 and clock distribution circuitry 24.

Signal selector 22 is operable to select one of a plurality of input signals based on a selection signal SEL and output that selected signal.

Looking at FIG. 5(a) it will be appreciated that the VCO output clock signals may be quadrature clock signals, namely a set of four timed-interleaved substantially sinusoidal clock signals $\theta_0$, $\theta_1$, $\theta_2$ and $\theta_3$ as shown, corresponding to those discussed above in connection with EP2849345 and EP2211468. As already mentioned above, it will be appreciated that any one of these clock signals $\theta_0$ to $\theta_3$ could be referred to as the clock signal VCO.

FIG. 5(b) presents equivalent quadrature square-wave switched logic level clock signals, also labelled $\theta_0$, $\theta_1$, $\theta_2$ and $\theta_3$, to indicate that the VCO 10 may output clock signals of different types, depending on the application and clock frequencies employed. Also, the clock signals output from the divider 14 may be such square-wave signals even if its input signal(s) is a sinusoidal signal.

Embodiments of the present invention may operate on sinusoidal or square-wave clock signals (as well as other shaped of clock signal), however the following description will refer to such square-wave clock signals (e.g. as output by divider 14) for ease of understanding of the present invention. Although it will be appreciated that the techniques and circuitry disclosed herein may operate based on sinusoidal or square-wave clock signals, it will become apparent that there are significant advantages associated which such square-wave signals (for example, linearity in the operation).

As indicated in FIG. 5(c), with quadrature, time-interleaved clock signals $\theta_0$, $\theta_1$, $\theta_2$ and $\theta_3$, it is possible to select one of them for which the rising edge of the clock signal REFCLK appears towards the centre or within a central portion of the period of time while that signal is high in the case of a square-wave signal (or in its peak rather than trough section in the case of a sinusoidal signal). The advantage of this will become apparent later. A simple edge detector could be used to decide which of the clock signals $\theta_0$ to $\theta_3$ to select, or it may be known (e.g. when the overall PLL circuitry is close to or at lock on) which of those clock signals should be selected, or all of those clock signals may be tested in a search operation to determine for which of them the rising edge of the clock signal REFCLK is located in the desired period.

Incidentally, although rising edges are focussed on here for convenience, falling edges could equally be employed, as could low/trough periods of the signals $\theta_0$ to $\theta_3$.

Thus, the signal selector 22 of FIG. 5(c) may be supplied with the clock signals $\theta_0$ to $\theta_3$ and may be employed to select the desired one of them based on the selection signal SEL and to output that selection signal as the clock signal $\theta_{SEL}$.

The circuitry 30 comprises a common tail node 32 and first and second nodes 34 and 36. A first signal path 38 connects the common tail node 32 to the first node 34 and a second signal path 40 connects the common tail node 32 to the second node 36.

A controllable current source 42 is connected to the common tail node 32 and connected to receive the selected clock signal $\theta_{SEL}$ as its control signal. As such, the controllable current source 42 is configured to cause the current pulse $Q_T$ formed from the current $I_T$ (see FIG. 3) to flow through the common tail node 32 in dependence upon the selected clock signal $\theta_{SEL}$.

Taking the clock signal $\theta_3$ in FIG. 5(b) as the clock signal $\theta_{SEL}$, given that the rising edge of the clock signal REFCLK in FIG. 5(c) falls comfortably within the period when the clock signal $\theta_3$ is high, the controllable current source 42 may be considered to cause current $I_T$ to flow when the clock signal $\theta_3$ is high, creating the current pulse $Q_T$ such that it mirrors in shape the cross-hatched part of the clock signal $\theta_3$ in FIG. 5(b).

Switches 44 and 46 are provided along the first and second paths 38 and 40, respectively. Those switches 44 and 46 are also connected to be controlled based on clock signals /REFCLK and REFCLK, respectively, provided from clock distribution circuitry 24 in FIG. 4(a). Switch 44 is configured to be closed (conductive) when REFCLK is low and open when REFCLK is high, and, conversely, switch 46 is configured to be open when REFCLK is low and closed (conductive) when REFCLK is high. It will be appreciated that switches 44 and 46 could be implemented as NMOS MOSFETs whose channels are connected along paths 38 and 40 respectively and whose gate terminals are controlled by clock signals /REFCLK and REFCLK, respectively.

Accordingly, the portion $Q_1$ of the current pulse $Q_T$ before the rising edge of the clock REFCLK is caused to flow along the first path 38 and the portion $Q_2$ of the current pulse $Q_T$ after the rising edge of the clock signal REFCLK is caused to flow along the second path 40, in line with FIG. 3. That is, the circuitry 30, and specifically the arrangement of switches 44 and 46 along the first and second paths 38 and 40 connected to the common tail node 32, is configured to steer the current pulse $Q_T$ from one path to the next over time, dependent on the clock signal REFCLK. This current-mode operation affords a high degree of accuracy, because all of the current pulse $Q_T$ must flow down one or other of the first and second paths 38 and 40. That is, there is no loss of current in contrast to voltage-mode operation which may suffer from losses, and be sensitive to mismatches, which lead to inaccuracies. Mismatches between the switches 44 and 46, and between the capacitors 62 and 64 (introduced below), would lead to gain or offset errors in the conversion which can be corrected for as commented on later, not linearity errors in the time-to-digital conversion.

Circuitry 30 further comprises an output signal unit 50, comprising a capacitor bank 52 and an ADC unit 54.

Capacitor bank 52 comprises capacitors 62 and 64 and reset switches 66 and 68. Capacitors 62 and 64 are connected to the ends of paths 38 and 40 at the first and second nodes 34 and 36, respectively. Thus, pulse portions $Q_1$ and $Q_2$ create corresponding potential differences $V_1$ and $V_2$ across capacitors 62 and 64. If capacitors 62 and 64 have equal capacitances, then the potential differences $V_1$ and $V_2$ are proportional to the amounts of charge in pulse portions $Q_1$ and $Q_2$ and consequently are reflective of the position of the rising edge of the clock signal REFCLK relative to the current pulse $Q_T$ and thus the timing difference (or phase difference or phase lag) between the clock signals REFCLK and $\theta_{SEL}$.

For example, if the rising edge of the clock signal REFCLK is exactly in the middle of the period when the clock signal $\theta_{SEL}$ is high, then the pulse portion $Q_1$ and the pulse portion $Q_2$ will be the same size as one another (i.e. having the same amount of charge, with the current pulses they are made up of having the same areas), leading to $=V_2$ assuming that the capacitances of the capacitors 62 and 64 are equal. If the rising edge of REFCLK comes slightly earlier, then the relationship will be $V_1<V_2$ and if it comes slightly later then the relationship will be $V_1>V_2$. Thus, by examining $V_1$ and $V_2$, for example by looking at the difference $V_2-V_1$ or vice versa, it is possible to assess the location of the rising edge of the clock signal REFCLK relative to a rising edge of the clock signal $\theta_{SEL}$.

Figure 2:
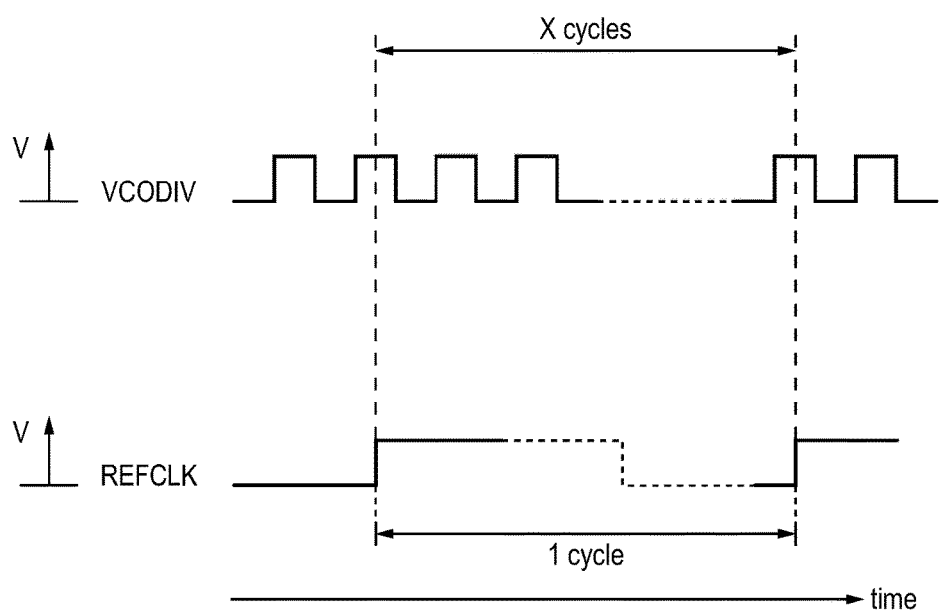

Looking back to FIG. 2, this can contribute to an assessment of the fractional part of the value X (the integer part could be assessed e.g. by simple edge counting). Further, to get a single value of X it will be possible to find the relative location of two consecutive rising edges of REFCLK. However, a more practical scheme is to continually "watch" the rising edges of the clock signal REFCLK so as to get a sequence of measures of the relative location of those edges compared to the clock signal $\theta_{SEL}$, i.e. measures of the timing differences between those signals. Such a scheme will be described in more detail below. Note that the reset switches 66 and 68 of the circuitry 30 may be used to reset the potential differences across the capacitors 62 and 64 between taking such measures of the timing differences between the signals REFCLK and $\theta_{SEL}$. It will be understood that by looking at the results of multiple conversions, calibration can be used to correct for differences between phases or cycles.

ADC unit 54 is connected to receive the potential differences $V_1$ and $V_2$ or a potential difference generated from them such as $V_2-V_1$, and to output a digital value indicative of the supplied potential difference or differences. The output digital value (in the same way as the voltages $V_1$ and/or $V_2$, or indeed $V_2-V_1$) is a measurement of the timing difference between the clock signals REFCLK and $\theta_{SEL}$. As such, circuitry 30 could be referred to as a time-to-digital converter (TDC).

Figure 6:
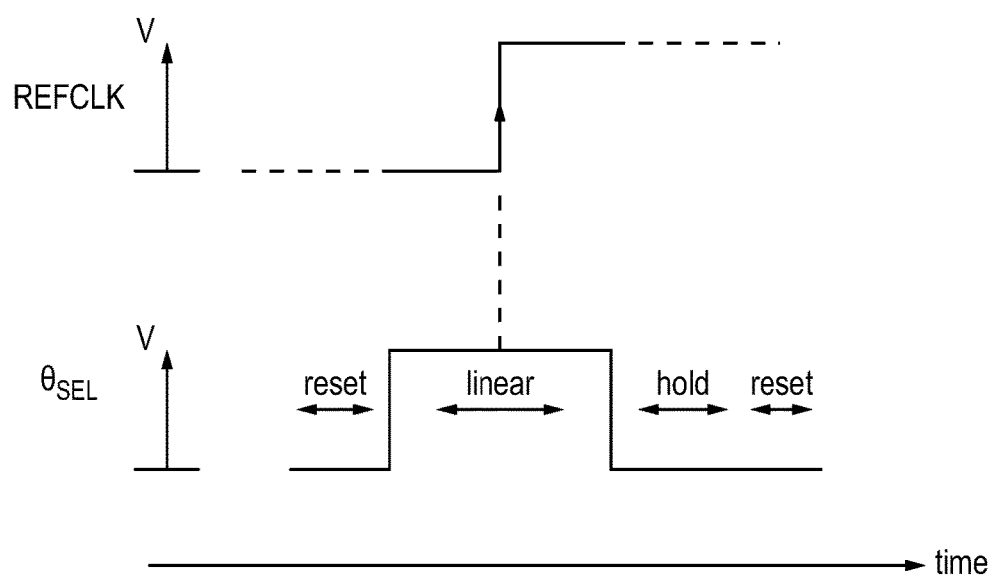
FIG. 6 is a signal timing diagram showing clock signal REFCLK relative to clock signal $\theta_{SEL}$.

FIG. 6 is a signal timing diagram showing clock signal REFCLK relative to clock signal $\theta_{SEL}$, and thus is similar to parts of FIG. 5.

Looking back to FIGS. 5(b) and 5(c), an advantage of selecting the one of the clock signals $\theta_0$ to $\theta_3$ which puts the rising edge of the clock signal REFCLK towards the middle of the high period, in the case of FIG. 5(b) the cross-hatched portion of clock signal $\theta_3$, is that the ADC unit 54 (and indeed the voltage signals $V_1$ and $V_2$, and the difference of $V_2-V_1$) are in a linear region as indicated in FIG. 6.

Consider for example that the current pulse $Q_T$ will not be exactly rectangular shaped, i.e. with perfect rising and falling edges, and thus the middle portion (i.e. minus the leading and trailing edge portions) will be the more linear portion of the pulse. Also note that using the square-wave signals of FIG. 5(b) to generate the current pulse is preferable to using the sinusoidal signals of FIG. 5(a), since the resulting current pulse will have a flat-topped, square-wave or rectangular shape, aiding the linear relationship between: (a) where REFCLK appears relative to $\theta_{SEL}$; and (b) the change in voltage signals $V_1$ and $V_2$.

Of course, rather than adopting the circuitry 20 of FIG. 4(a), it would be possible to provide four sets of circuitry 30, one per clock signal $\theta_0$ to $\theta_3$, i.e. with the controllable current source 42 of each controlled by its corresponding one of clock signals $\theta_0$ to $\theta_3$.

This would have the advantage that at least one of those sets of circuitry 30 would catch the rising edge of the clock signal REFCLK in its linear region, enabling the rising edge to be (searched) for by looking at the results of the four sets of circuitry 30. Also, consider the need to hold the voltages $V_1$ and $V_2$ over the capacitors 62 and 64 while the ADC unit 54 generates its digital output (e.g. by successive approximation in the case of a SAR ADC), and then reset those voltages using the reset switches 66 and 68 before the next measurement is taken, as indicated in FIG. 6. With four sets of circuitry 30 as mentioned above, this linear-hold-reset cycle would be staggered between the four sets (see FIG. 5(b)), so that each set could be ready to take a measurement for its own linear period.

However, considering the PLL circuitry 1 of FIG. 1 again, and bearing in mind that the circuitry 30 could be employed in the phase comparator 4, it may be known which of clocks $\theta_0$ to $\theta_3$ would be in its linear period for each rising edge of the clock signal REFCLK when the PLL circuitry is in or close to being in lock (see FIG. 2), so that the circuitry 20 could be employed to select the appropriate one of the clock signals $\theta_0$ to $\theta_3$ for each rising edge of the clock signal REFCLK, thus negating the need to provide four sets of circuitry 30.

When the PLL circuitry is in, or is close to being in, lock, the integer part of the value X will be known (in the sense that it may be stable or could be calculated rather than needing measurement), and only the fractional part need be measured each time the rising edge of the clock signal REFCLK comes along.

Further it is not necessary to measure the relative position of every rising edge of the clock signal REFCLK. It may be possible to measure only the relative timing positions of certain such edges, for example every other one, or even 1 in every 100 edges. This is of course an implementation detail, however there may be some power consumption saving in not considering every rising edge at the cost of accuracy.

Considering further the theory behind FIGS. 3 and 6, in some embodiments the value measured by circuitry 30 is $Q_1-Q_2$, effectively $V_1-V_2$. If the REFCLK edge is exactly in the middle of the charge pulse the result is zero (and this can be set as ADC midscale). Considering FIG. 5(b), there is a choice of 4 clock phases, and this choice could be considered to equate to a coarse TDC. Once focussed on one of the phases, i.e. $\theta_{SEL}$, the ADC in circuitry 30 has to cover 90 degrees, this equating to a fine TDC. This 90 degrees is about half the total width of one charge pulse (i.e. each charge pulse is approximately half a cycle wide, equating to 180 degrees). Thus, it is not necessary to use the parts of the pulses near to their beginning and end which may not be exactly linear (constant current) as discussed above, due to switching effects, rise/fall time etc. It is preferable to focus on the middle part of each pulse, where the pulse shape is most accurate and linear since in this location is has a predictable flat top, substantially free from the switching effects, rise/fall time etc.

Ignoring the need for any overlap between the ranges covered by the four phases, then a charge pulse split of 25%:75% (REFCLK early) could be set as ADC negative full scale (e.g. −128 code for an 8 b ADC), and a split of 75%:25% (REFCLK late) could be set as ADC positive full scale (e.g. +127 code for an 8 b ADC).

To allow for some overlap in case there was some error in selecting the right pulse, i.e. the correct phase in FIG. 5(b), it is possible to set the ADC gain to be lower than this (e.g. by adjusting its reference voltage which sets the charge:code gain) so that 90 degrees does not occupy the entire ADC range (256 LSB). As an example, the gain could be so that 227 LSB corresponds to 90 degrees, with the output ADC code then being multiplied by 9/8 to get back to a digital range of 256 for calculations. In this way, the ADC range could be adjusted to cover 90*9/8=101 degrees, meaning that there are approximately 5 degrees "extra" at each end, or 10 degrees overall overlap between adjacent pulses/phases.

Figure 7:
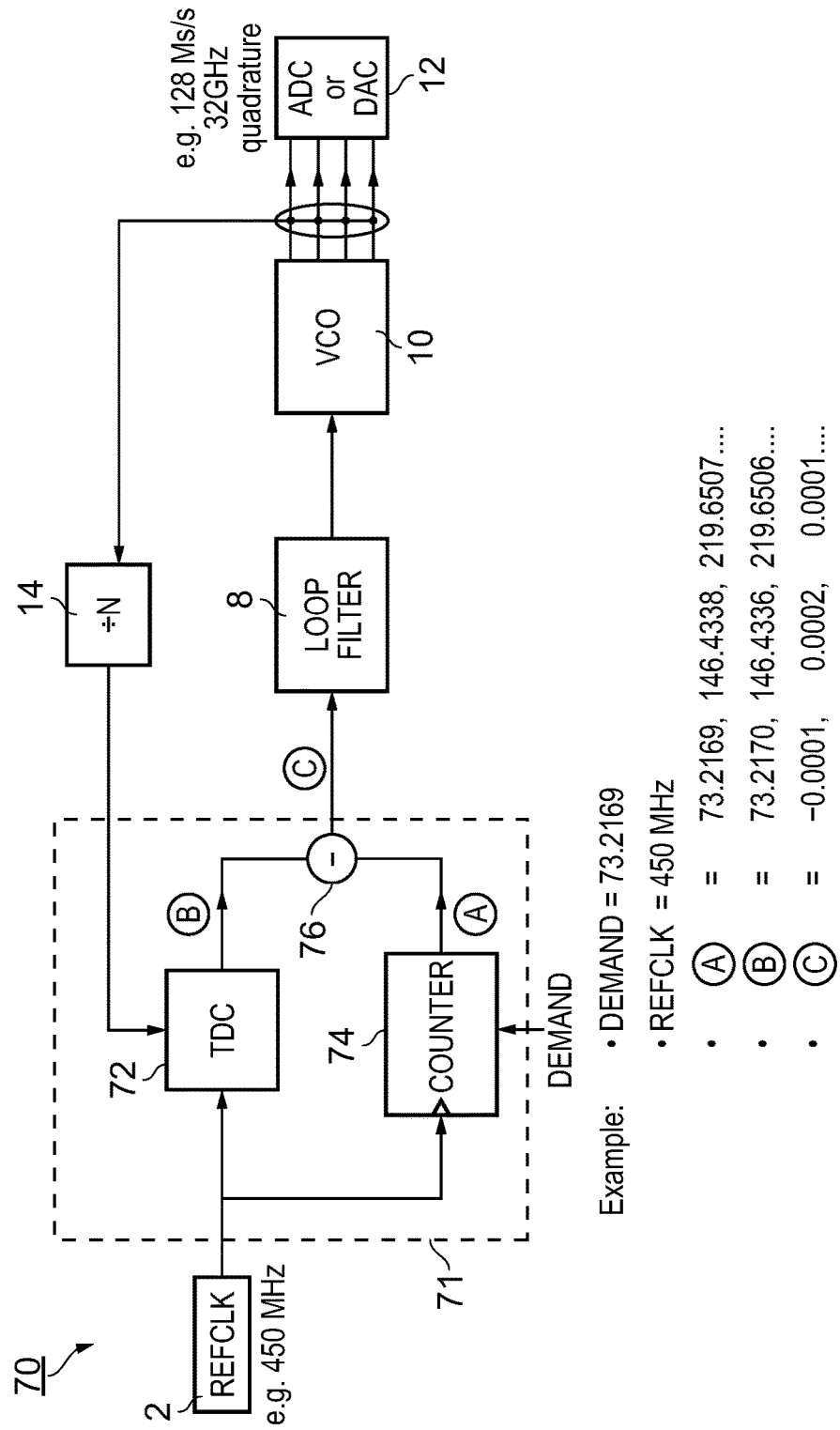
FIG. 7 is a schematic diagram showing PLL circuitry 70 embodying the present invention.

FIG. 7 is a schematic diagram of PLL circuitry 70 embodying the present invention. The PLL circuitry 70 naturally has some similarities with the PLL circuitry 1 of FIG. 1, and thus like elements are denoted in the same way and duplicate description is omitted.

A significant difference between the circuitry 70 and the circuitry 1 is that the phase comparator 4 has been replaced with phase comparator 71, itself embodying the present invention. The phase comparator 71 comprises a time-to-digital converter (TDC) 72, a counter 74 and a subtractor 76. The TDC 72 itself embodies the present invention.

The phase comparator 71 is connected to receive the reference clock signal REFCLK and the clock signal fed back from the VCO, in this case via the divider 14. The TDC 72, within the phase comparator 71, also receives these signals.

The TDC 72 is operable, based on its received signals, to outputs an integer+fraction value, having measured where the REFCLK rising edge lies and produced a digital output, using the techniques described above in connection with FIGS. 3 to 6. Thus, the TDC 72 may be considered to comprise the circuitry 30, or the circuitry 20 and 30 in combination, of FIG. 4. As described above, such circuitry is operable to determine how many cycles (integer+fraction) of the VCO clock signal (via monitoring VCODIV—e.g. using a counter) correspond to one cycle of the reference clock signal (REFCLK).

Also as described above, the TDC 72 is operable to repeatedly output such integer+fraction values, i.e. to repeatedly measure a timing difference between its input signals. That is, it may repeatedly measure the relationship between rising edges of the reference clock signal REFCLK and the VCO clock signal.

The counter 74 is connected to receive a "demand" or target value, indicating the desired output frequency expressed as how many cycles (integer+fraction) of the VCO clock signal should correspond to one cycle of the reference clock signal (REFCLK). In the example in FIG. 7, the demand value is 73.2169. The counter 74 may be configured to receive this demand value as an analogue signal, however preferably it is received as a digital value.

The counter 74 is also connected to be clocked by the signal REFCLK, and is configured to increment its output by the demand value each time it is clocked. Thus its output A (see FIG. 7) in this example reads 73.2169, 146.4338, 219.6507 etc. as target values associated with successive REFCLK clock cycles (e.g. rising edges).

The TDC 72 is configured to output an output B of corresponding actual measured values as mentioned above, in this example corresponding to the same successive REFCLK clock cycles as for the values of output A. The subtractor 76 is connected to receive outputs A and B as indicated, and to generate difference output C, as also indicated in FIG. 7. Example values for outputs A, B and C are indicated together in FIG. 7, and these may all be handled as digital values.

Figure 1:
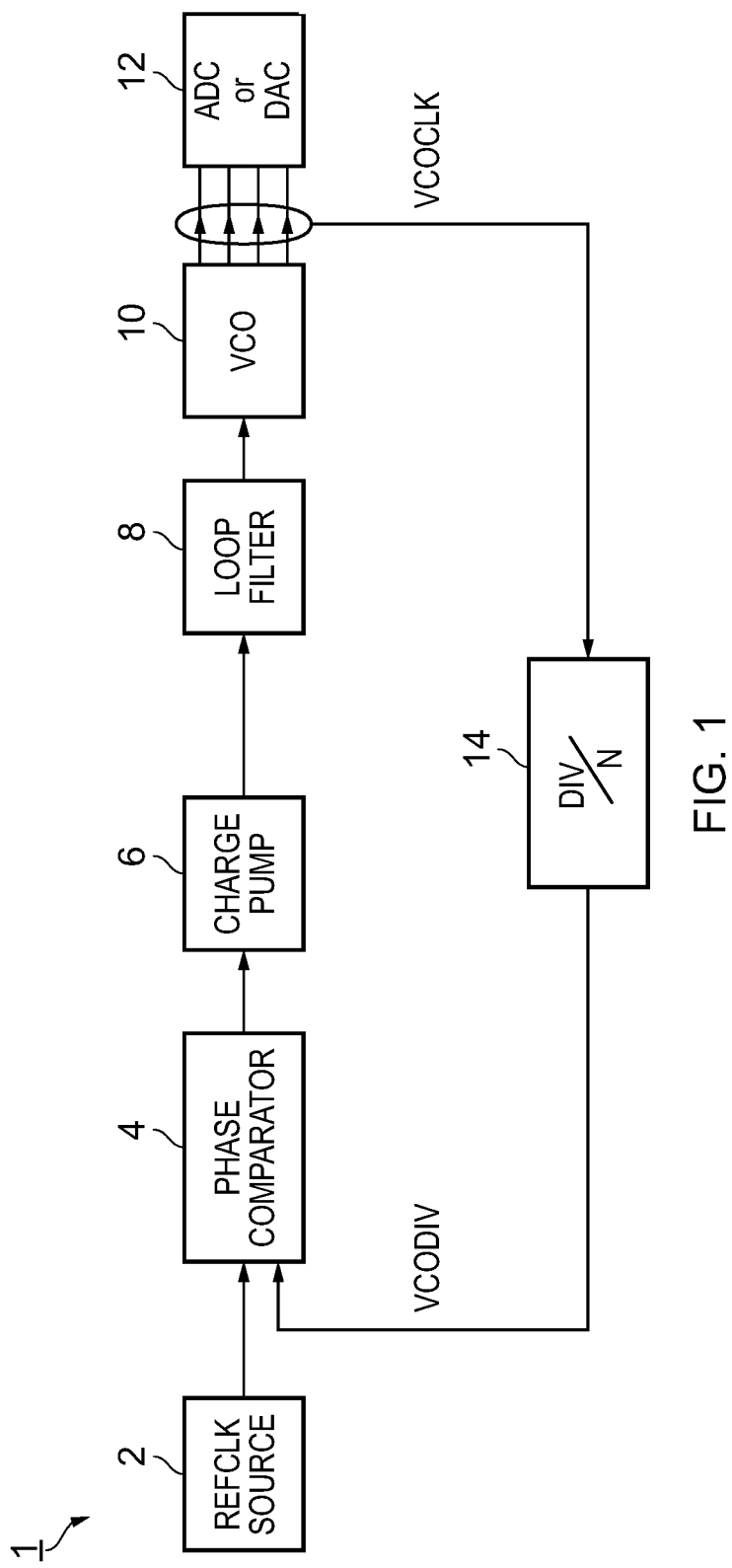

The output C is the output of the phase comparator 71, and is fed via the loop filter 8 (to average noise) to control the VCO 10, in a similar manner to that already described in connection with FIG. 1.

As described above, once the PLL circuitry 70 is (or is close to being) locked, it may no longer be necessary for the TDC 72 to measure the integer part of the timing difference between its input signals. That is, only the fraction part may need to be actually measured, since the integer part may effectively be known. Further, as described in connection with FIGS. 4 and 5, once the PLL circuitry 70 is (or is close to being) locked it may be known in which phase (see FIG. 5(b)) each rising edge of REFCLK will fall, so that selector 22 may be used to select the appropriate phase to be used for each rising edge of REFCLK in turn, to achieve linear operation.

Figure 8:
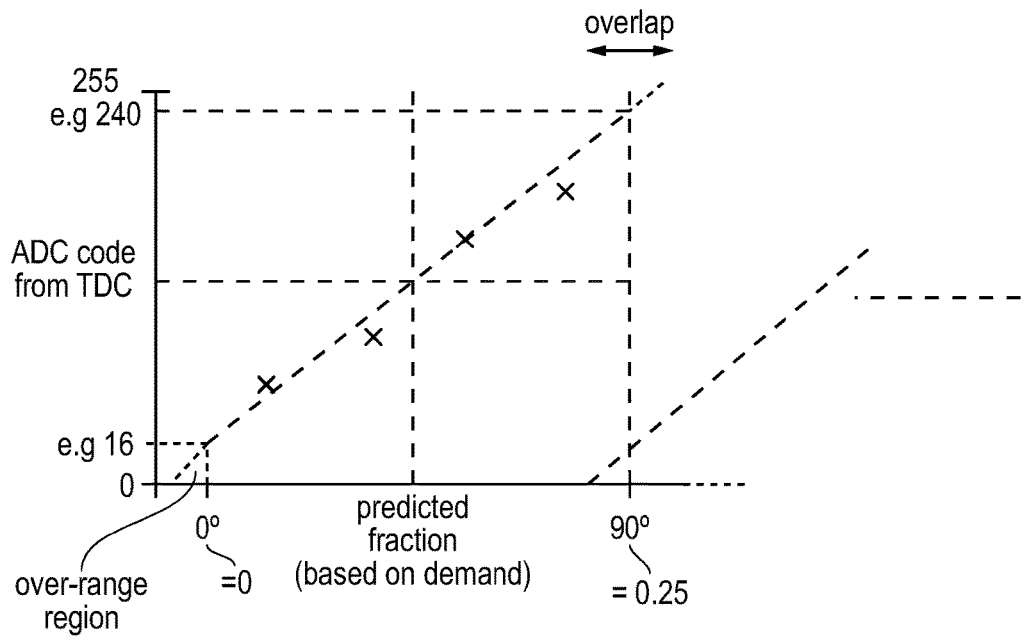
FIG. 8 presents graphs useful for understanding how the FIG. 7 circuitry may be controlled.
Figure 8:
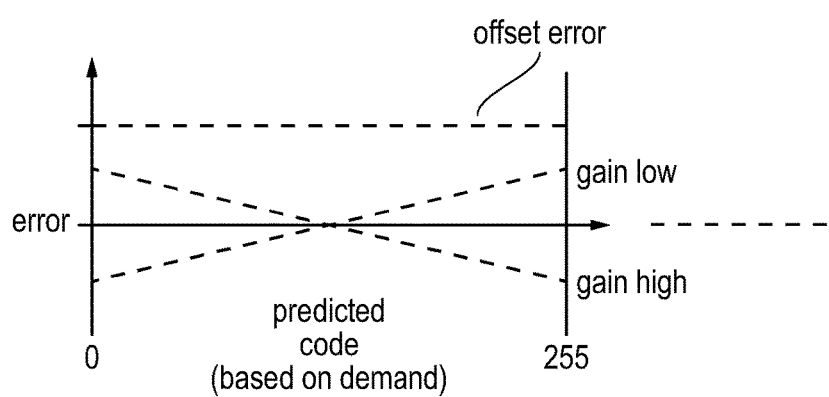

FIG. 8 presents graphs indicating how the circuitry embodying the present invention may be calibrated or controlled to improve its performance.

For example, it would be possible to keep a record of predicted (or demanded or target or reference) fractional values and the corresponding measured actual fractional values. These could be plotted as in the upper graph in FIG. 8.

The X-axis is for the predicted fractional values, here shown in relation to a 90° phase range covered by a particular one of the VCO clock phases $\theta_0$ to $\theta_3$ as in FIG. 5 (b), for example phase $\theta_0$. It will be appreciated that the X-axis may continue to cover the other three phases in a similar way (although not explicitly shown in FIG. 8). The Y-axis is for the measured fractional values, here shown as ADC output codes (i.e. digital values) within the ADC range 0 to 255 as an example. Both such axes could of course be presented in terms of ADC output codes or phase ranges.

Thus, only a quarter of the possible range (0° to 90° in phase, or 0 to 0.25 in terms of fractional values) is shown in FIG. 8 for simplicity. In order to keep safely within the ADC (of the TDC) range, the coverage range of multiple ADCs may be overlapped as also indicated (see also the indicated over-range region). Once the PLL circuitry is locked, it may of course be known in which range the next measured value will fall, based on the predicted fraction values.

If the PLL circuitry 70, including the TDC 72, were operating perfectly and in lock, it may be expected that the predicted and measured values are the same, and as such the plotted values would fall on the dashed diagonal lines (effectively, X value=Y value) indicated. In practice, the plotted values (indicated as crosses) will fall close to these diagonal lines as indicated.

The lower graph in FIG. 8 corresponds to the same phase range as for the upper graph, and similarly may extend to cover the other three phases in a similar way (although not shown for simplicity). This lower graph however is provided to plot the error values corresponding to the plotted values in the graph, for example equating to measured fraction−predicted fraction.

To avoid overcomplicating FIG. 8, specific such error values have not been plotted in the lower graph. However, potential patterns which these error values might create have been indicated by dashed lines. What sort of form or pattern these values create will indicate whether the gain of the ADC (of the TDC) is too high or low or whether there is an offset error. For example, the slope of such a pattern may indicate a gain error (e.g. gain too high or too low) and the vertical offset of such a pattern may indicated an offset error.

The form or pattern (e.g. slope and offset) of the trace in the lower graph could be assessed in practice e.g. by accumulating/storing errors associated with the left-hand half of the upper graph (i.e. of a 90° phase range) in one register and those associated with the right-hand half of the upper graph in another register over time. The totals or averages of these values over time may then be indicative of the form or pattern, avoiding the need to actually plot and analyse the graphs per se.

Accordingly, the above-described circuitry may be provided with control circuitry operable, based on such an analysis or comparison of the predicted and measured values, to control the TDC 72, or other parts of the circuitry 71 or 70, to reduce the errors experienced. Gain errors could be compensated for e.g. by trimming the ADC reference value or tail current (i.e. the magnitude of $I_T$). Offset errors could be compensated for by an offset trim in the ADC comparator, adjusting the timing in the clocks, or even adding a digital offset in the TDC output. These are of course only examples.

It will be appreciated that the circuitry disclosed herein could be described as circuitry for measuring a timing difference between first and second signals, as a time-to-digital converter, as a phase detector or phase comparator, or as PLL circuitry. Such circuitry may be provided as a clock source, for example to control mixed-signal circuitry such as DAC or ADC circuitry. Circuitry of the present invention may be implemented as DAC or ADC circuitry.

Circuitry of the present invention may be implemented as integrated circuitry, for example on an IC chip such as a flip chip. The present invention extends to integrated circuitry and IC chips as mentioned above, circuit boards comprising such IC chips, and communication networks (for example, internet fiber-optic networks and wireless networks) and network equipment of such networks, comprising such circuit boards.

The present invention may be embodied in many different ways in the light of the above disclosure, within the spirit and scope of the appended claims.

The invention claimed is:

1. Current-mode circuitry for measuring a timing difference between first and second signals, the circuitry comprising:
    a tail node configured during a measurement operation to receive a current pulse in dependence upon the first signal;
    first and second nodes conductively connectable to said tail node along respective first and second paths;
    steering circuitry configured during the measurement operation to control such connections between the tail node and the first and second nodes based on the second signal to steer the current pulse so that a first portion of the current pulse passes along the first path and a second portion of the current pulse passes along the second path in dependence upon the timing difference between said first and second signals; and
    a signal output unit configured to output a measurement-result signal indicating a measure of said timing difference based upon one or both of the first and second portions,
    wherein the signal output unit comprises first and second capacitances connected to the first and second nodes, respectively, for converting said first and second portions of the current pulse into corresponding first and second potential differences.

2. The current-mode circuitry according to claim 1, wherein the steering circuitry is configured to steer the current such that the first portion passes along the first path and then the second portion passes along the second path.

3. The current-mode circuitry according to claim 1, wherein the steering circuitry comprises switching circuitry provided along said paths, the switching circuitry configured such that the conductivity of the connections between the tail node and the first and second nodes is controlled by the second signal.

4. The current-mode circuitry according to claim 3, wherein the switching circuitry comprises a first transistor whose channel forms part of the first path and a second transistor whose channel forms part of the second path, and wherein gate terminals of those transistors are controlled by the second signal.

5. The current-mode circuitry according to claim 1, comprising a controllable current source configured to provide said current pulse in dependence upon the first signal.

6. The current-mode circuitry according to claim 1, wherein the signal output unit is configured to output the measurement-result signal based upon a difference in the size of the first and second portions, or in dependence upon the size of one of the first and second portions.

7. The current-mode circuitry according to claim 1, wherein the signal output unit comprises analogue-to-digital conversion circuitry and the measurement-result signal is a digital signal.

8. The current-mode circuitry according to claim 1, wherein:
    one or both of the first and second signals are switched logic level signals; and/or
    the first and second signals are clock signals or other repetitive signals.

9. A phase detector, comprising the current-mode circuitry according to claim 1.

10. The phase detector according to claim 9, wherein the current-mode circuitry is configured to repeatedly measure such timing differences between the first and second signals, generating a sequence of measures of the timing differences, and wherein the phase detector comprises:
    reference circuitry operable, in dependence upon a target relationship between said first and second signals, to generate a sequence of reference values indicating timing differences between the first and second signals corresponding to the target relationship;
    comparison circuitry configured to compare the sequence of measures with the sequence of reference values; and
    a signal output unit operable to output a phase-detection signal in dependence upon a result of the comparison.

11. The phase detector according to claim 10, further comprising:
    calibration circuitry operable to calibrate operation of the phase detector in dependence upon the sequences of reference values and measures.

12. Phase-locked loop circuitry, comprising the phase detector according to claim 9.

13. Digital-to-analogue converter circuitry or analogue-to-digital converter circuitry, comprising the current-mode circuitry according to claim 1.

14. An IC chip, comprising the current-mode circuitry according to claim 1.

15. Digital-to-analogue converter circuitry or analogue-to-digital converter circuitry, comprising the phase detector according to claim 9.

16. Digital-to-analogue converter circuitry or analogue-to-digital converter circuitry, comprising the phase-locked loop circuitry according to claim 12.

17. An IC chip, comprising the phase detector according to claim 9.

18. An IC chip, comprising the phase-locked loop circuitry according to claim 12.

19. An IC chip, comprising the digital-to-analogue converter circuitry or analogue-to-digital converter circuitry according to claim 13.

20. Current-mode circuitry for measuring a timing difference between first and second signals, the circuitry comprising:
    a tail node configured during a measurement operation to receive a current pulse in dependence upon the first signal;
    first and second nodes conductively connectable to said tail node along respective first and second paths;
    steering circuitry configured during the measurement operation to control such connections between the tail node and the first and second nodes based on the second signal to steer the current pulse so that a first portion of the current pulse passes along the first path and a second portion of the current pulse passes along the second path in dependence upon the timing difference between said first and second signals; and
    a signal output unit configured to output a measurement-result signal indicating a measure of said timing difference based upon one or both of the first and second portions,
    wherein the signal output unit comprises analogue-to-digital conversion circuitry and the measurement-result signal is a digital signal.

21. A phase detector comprising current-mode circuitry for measuring a timing difference between first and second signals, the current-mode circuitry comprising:
    a tail node configured during a measurement operation to receive a current pulse in dependence upon the first signal;
    first and second nodes conductively connectable to said tail node along respective first and second paths;
    steering circuitry configured during the measurement operation to control such connections between the tail node and the first and second nodes based on the second signal to steer the current pulse so that a first portion of the current pulse passes along the first path and a second portion of the current pulse passes along the second path in dependence upon the timing difference between said first and second signals; and
    a signal output unit configured to output a measurement-result signal indicating a measure of said timing difference based upon one or both of the first and second portions,
    wherein the current-mode circuitry is configured to repeatedly measure such timing differences between the first and second signals, generating a sequence of measures of the timing differences, and wherein the phase detector comprises:
    reference circuitry operable, in dependence upon a target relationship between said first and second signals, to generate a sequence of reference values indicating timing differences between the first and second signals corresponding to the target relationship;
    comparison circuitry configured to compare the sequence of r measures with the sequence of reference values; and
    a signal output unit operable to output a phase-detection signal in dependence upon a result of the comparison.

\* \* \* \* \*